United States Patent
Chang et al.

(10) Patent No.: US 10,204,681 B2
(45) Date of Patent: Feb. 12, 2019

(54) CONTROL CIRCUIT CONFIGURED TO TERMINATE A SET OPERATION AND A RESET OPERATION OF A RESISTIVE MEMORY CELL OF MEMORY ARRAY BASED ON THE VOLTAGE VARIATION ON THE DATA LINE OF THE RESISTIVE MEMORY CELL

(71) Applicant: NATIONAL TSING HUA UNIVERSITY, Hsinchu (TW)

(72) Inventors: Meng-Fan Chang, Taichung (TW); Wen-Zhang Lin, Hsinchu (TW); Li-Ya Lai, Taichung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 15/591,085

(22) Filed: May 9, 2017

(65) Prior Publication Data

US 2018/0330785 A1   Nov. 15, 2018

(51) Int. Cl.
*G11C 13/00* (2006.01)

(52) U.S. Cl.
CPC ...... *G11C 13/0069* (2013.01); *G11C 13/0007* (2013.01); *G11C 13/0026* (2013.01); *G11C 13/0097* (2013.01)

(58) Field of Classification Search
CPC .................................................. G11C 13/0069
See application file for complete search history.

(56) References Cited

U.S. PATENT DOCUMENTS

| | | | |
|---|---|---|---|
| 9,722,584 B1* | 8/2017 | Chang | H03K 3/356008 |
| 2006/0126380 A1* | 6/2006 | Osada | G11C 11/5678 365/163 |
| 2006/0181932 A1* | 8/2006 | Cho | G11C 7/12 365/185.23 |
| 2009/0323391 A1* | 12/2009 | Scheuerlein | G11C 13/0007 365/148 |
| 2010/0020594 A1* | 1/2010 | De Sandre | G11C 13/0004 365/163 |
| 2015/0063003 A1* | 3/2015 | Tsukada | G11C 13/004 365/148 |
| 2016/0118120 A1* | 4/2016 | Tseng | G11C 13/0097 365/148 |
| 2017/0221562 A1* | 8/2017 | Buchanan | G11C 13/0064 |

* cited by examiner

*Primary Examiner* — Anthan Tran
*Assistant Examiner* — Mushfique Siddique
(74) *Attorney, Agent, or Firm* — CKC & Partners Co., Ltd.

(57) ABSTRACT

The present disclosure provides a control circuit of a memory array. The control circuit includes a first switch and a set termination circuit. The first switch is connected between a first voltage source and a data line of a resistive memory cell of the memory array. The set termination circuit has a first terminal connected to a control terminal of the first switch and a second terminal connected to the data line of the resistive memory cell of the memory array. When a data line voltage of the data line decreases to be lower than a first voltage in a first duration of the resistive memory cell performing a set operation, the set termination circuit turns off the first switch to terminate the set operation by stopping providing the first voltage of the first voltage source to the data line.

6 Claims, 13 Drawing Sheets

CONTROL CIRCUIT CONFIGURED TO TERMINATE A SET OPERATION AND A RESET OPERATION OF A RESISTIVE MEMORY CELL OF MEMORY ARRAY BASED ON THE VOLTAGE VARIATION ON THE DATA LINE OF THE RESISTIVE MEMORY CELL

BACKGROUND

Technical Field

The present disclosure relates to a control circuit of a memory array. More particularly, the present disclosure relates to a control circuit terminating a set operation and a reset operation of a resistive memory cell of the memory array based on the voltage variation on the data line of the resistive memory cell.

Description of Related Art

Resistive random access memory (ReRAM) cells can include a select transistor and a programmable resistor. When a word line voltage and a bit line voltage are respectively applied to the gate and the source of the select transistor, a current can flow through the programmable resistor to change the resistance state of the programmable resistor. Specifically, the programmable resistor can interchange between a high resistance state (HRS) and a low resistance state (LRS) in response to the current. If the programmable resistor changes from the HRS to the LRS, this can be referred to as a set operation or a write-0 operation. On the other hand, if the programmable resistor changes from the LRS to the HRS, this can be referred to as a reset operation or a write-1 operation.

However, it is difficult to accurately monitor whether the set/reset operation of a ReRAM is finished. If the current is still applied to the ReRAM after the resistance state of the ReRAM is changed (i.e., the set/reset operation is not terminated in time), the ReRAM will suffer from the "over-set" or "over-reset" problem, and this will cause permanent damage to the ReRAM cell and degrade the endurance thereof. Hence, it is important to design a mechanism to properly terminate the set/reset operation to people with ordinary skills in the art.

Furthermore, the ReRAM cell usually has high resistance at its initial state, and it needs to be activated by a forming operation. After experiencing the forming operation, the ReRAM cell will form a filament which is conductive in the metal-oxide layer, and hence the ReRAM can be set or reset afterwards. In conventional ways, before the column multiplexing decoder switches the forming operation to the next column, the column multiplexing decoder has to wait for all of the ReRAMs on the same column to finish their forming operations. That is, even some of the ReRAMs on the same column finish their forming operations earlier, these ReRAMs still have to wait for other slower ReRAMs on the same column to finish their forming operation, and hence the efficiency of performing the forming operation is reduced. Therefore, it is crucial to design a mechanism for enhancing the efficiency of performing the forming operation.

SUMMARY

The present disclosure provides a control circuit of a memory array. The control circuit includes a first switch and a set termination circuit. The first switch is connected between a first voltage source and a data line of a resistive memory cell of the memory array. The set termination circuit has a first terminal connected to a control terminal of the first switch and a second terminal connected to the data line of the resistive memory cell of the memory array. When a data line voltage of the data line decreases to be lower than a first voltage in a first duration of the resistive memory cell performing a set operation, the set termination circuit turns off the first switch to terminate the set operation by stopping providing the first voltage of the first voltage source to the data line.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1A:
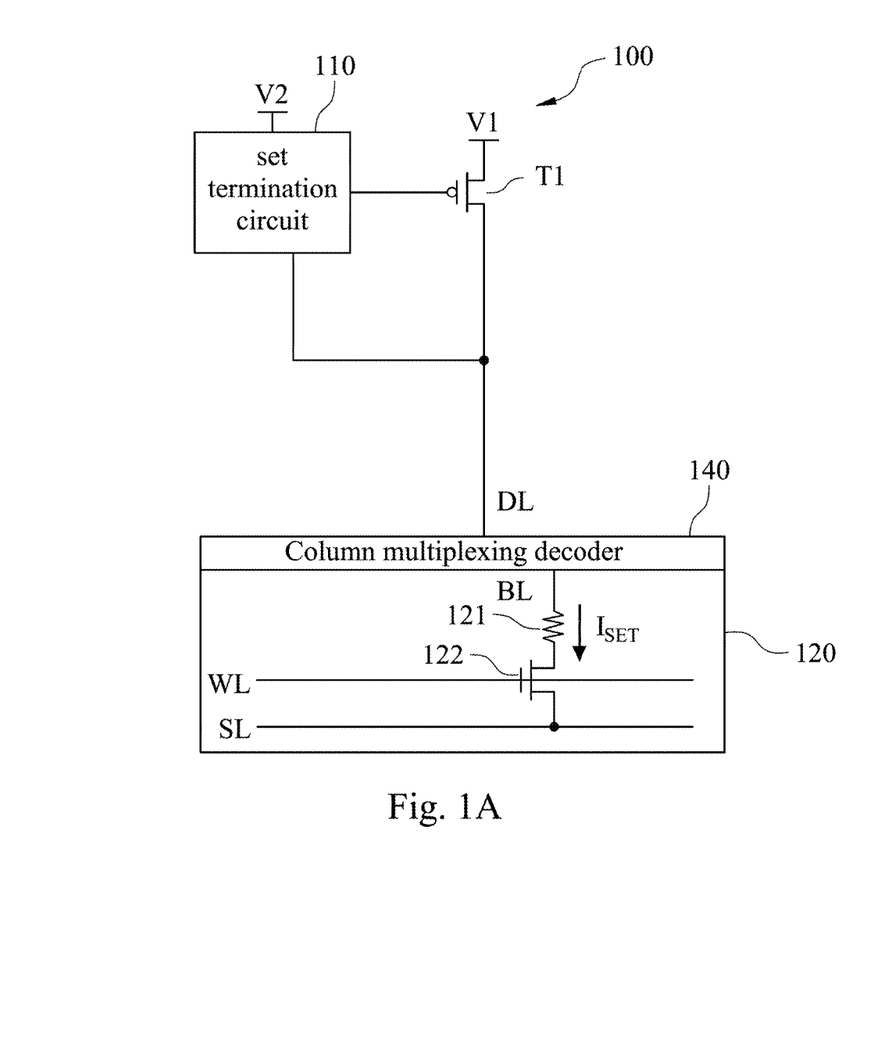
FIG. 1A is a schematic diagram illustrating the control circuit of the memory cell according to an exemplary embodiment of the present disclosure.
Figure 1B:
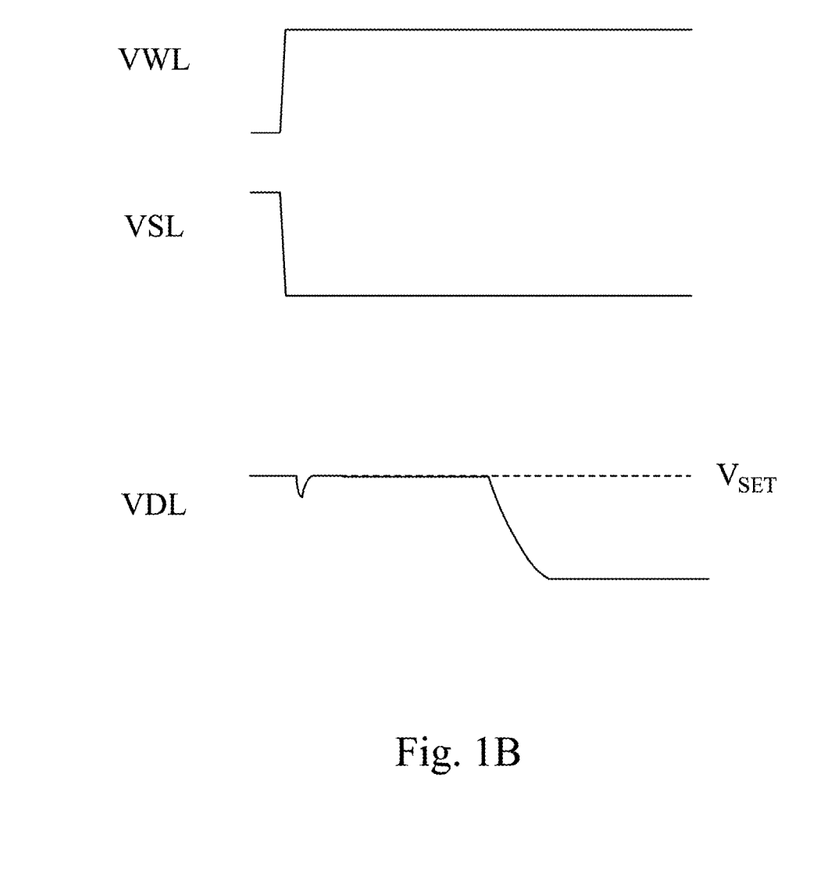
FIG. 1B illustrates various waveforms related to the set termination operation according to FIG. 1A.

FIG. 1A is a schematic diagram illustrating the control circuit 100 of the resistive memory cell 120 according to an exemplary embodiment of the present disclosure; FIG. 1B illustrates various waveforms related to a set termination operation according to FIG. 1A. Please refer to both of FIG. 1A and FIG. 1B. The control circuit 100 includes a first switch T1 and a set termination circuit 110. The first switch T1 is connected between a first voltage source V1 and a data line DL of a resistive memory cell 120 of the memory array. The set termination circuit 110 has a first terminal connected to a control terminal of the first switch T1, a second terminal connected to the data line DL of the resistive memory cell 120, and a third terminal coupled to a second voltage source V2.

The resistive memory cell 120 can be a ReRAM cell including a programmable resistor 121 and a select transistor 122. The programmable resistor 121 has a first terminal coupled to a bit line BL of the resistive memory cell 120, wherein the bit line BL is coupled to the data line DL through a column multiplexing decoder 140. The select transistor 122 has a first terminal coupled to a second terminal of the programmable resistor 121, a second terminal coupled to a source line SL, and a control terminal receiving a word line voltage VWL of a word line WL.

In a first duration of the resistive memory cell 120 performing the set operation, the word line voltage VWL (at a high level), a source line voltage VSL (at a low level), and a bit line voltage (at the high level (not shown)) can be respectively applied to the control terminal of the select transistor 122, the second terminal of the select transistor 122, and the bit line BL to create a current $I_{SET}$ for changing the resistive memory cell 120 from the HRS to the LRS. Meanwhile, the set termination circuit 110 can turn on the first switch T1 to provide a first voltage $V_{SET}$ of the first voltage source V1 to the data line DL to make the data line voltage VDL equal to the first voltage $V_{SET}$.

When the programmable resistor 121 is successfully changed to the LRS, there will occur a large voltage drop on the data line DL, such that the data line voltage VDL will be suddenly pulled down to be lower than the first voltage $V_{SET}$.

When the set termination circuit 110 detects that the data line voltage VDL of the data line DL decreases to be lower than the first voltage $V_{SET}$ while the resistive memory cell 120 performing the set operation, the set termination circuit 110 can turn off the first switch T1 to terminate the set operation by stopping providing the first voltage $V_{SET}$ of the first voltage source V1 to the data line DL.

In FIG. 1A, since the first switch T1 can be, for example, a p-type transistor, the set termination circuit 110 can provide a second voltage of the second voltage source V2 to the control terminal of the first switch T1 to turn off the first switch T1.

That is, the present disclosure proposes a control circuit 100 that can terminate the set operation of the resistive memory cell 120 of the memory array based on the voltage variation on the data line DL of the resistive memory cell 120 in a positive feedback fashion.

Figure 2A:
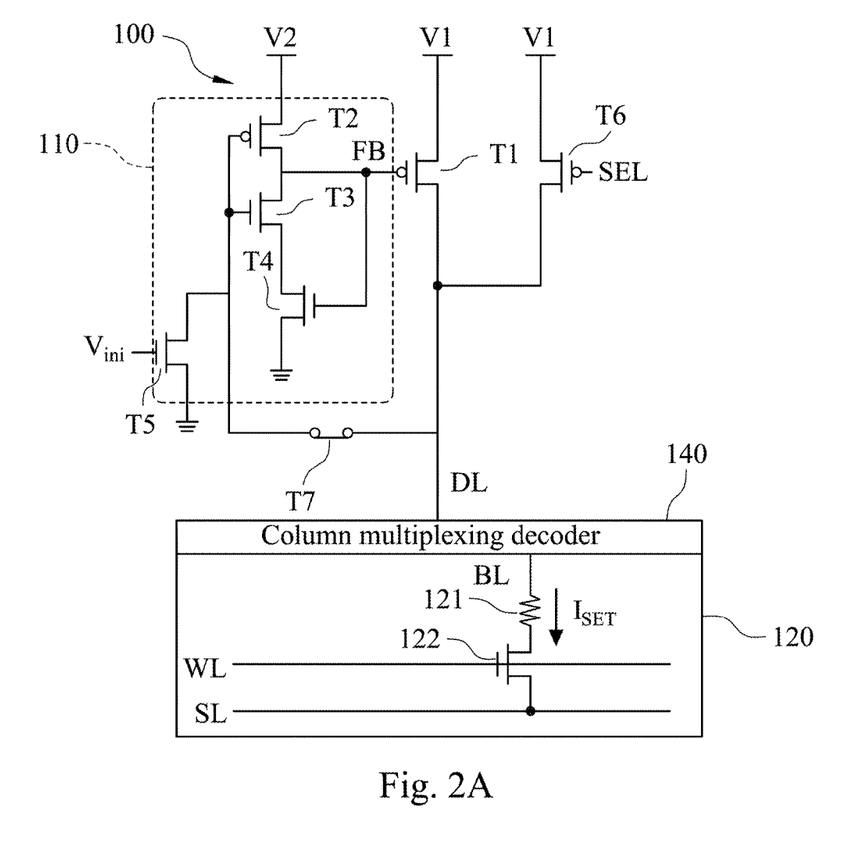
FIG. 2A is a schematic diagram illustrating the control circuit of the memory cell according to FIG. 1A of the present disclosure.
Figure 2B:
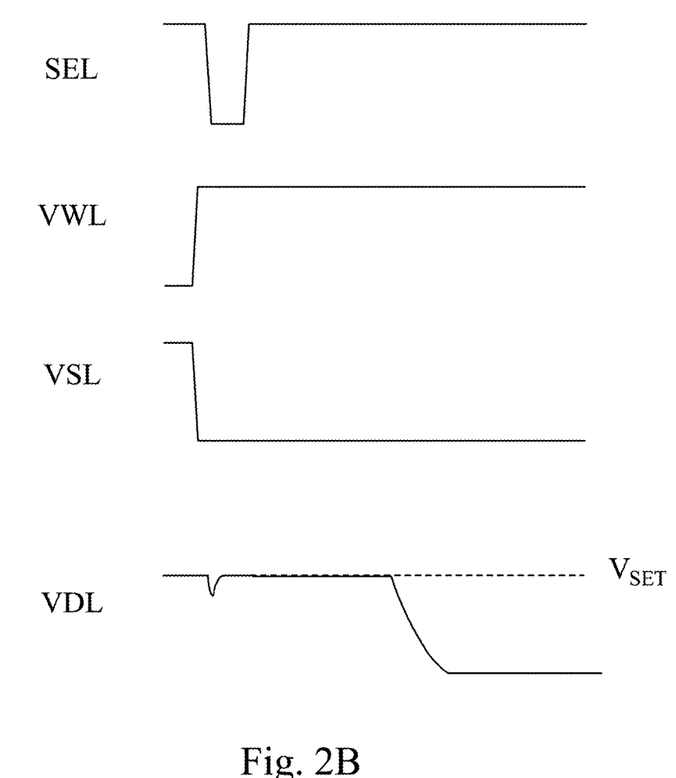
FIG. 2B illustrates various waveforms related to the set termination operation according to FIG. 2A.

FIG. 2A is a schematic diagram illustrating the control circuit 100 of the memory cell 120 according to FIG. 1A of the present disclosure; FIG. 2B illustrates various waveforms related to the set termination operation according to FIG. 2A. Please refer to both of FIG. 2A and FIG. 2B. In FIG. 2A, details of the set termination circuit 110 are exemplarily illustrated, where the set termination circuit 110 includes a second switch T2, a third switch T3, a fourth switch T4, and a fifth switch T5. The second switch T2 has a first terminal coupled to the second voltage source V2, a second terminal coupled to the control terminal of the first switch T1, and a control terminal coupled to the data line DL. The third switch T3 has a first terminal coupled to the second terminal of the second switch T2, and a control terminal coupled to the data line DL. The fourth switch T4 has a first terminal coupled to a second terminal of the third switch T3, a second terminal coupled to a ground, and a control terminal coupled to the second terminal of the second switch T2. The fifth switch T5 has a first terminal coupled to the control terminal of the second switch T2, a second terminal coupled to the ground, and a control terminal receiving an initiation signal $V_{ini}$.

As exemplarily shown in FIG. 2A, the first switch T1 and the second switch T2 can be n-type transistors, and the third switch T3 and the fourth switch T4 can be p-type transistors. Under this situation, when the data line voltage VDL of the data line DL decreases to be lower than the first voltage $V_{SET}$ while the resistive memory cell 120 performing the set operation, the second switch T2 will be turned on, while the third switch T3 will be turned off. As such, the voltage at the node FB will be pulled up to be equal to the second voltage of the second voltage source V2, and hence the first switch T1 will be turned off to terminate the set operation by stopping providing the first voltage $V_{SET}$ of the first voltage source V1 to the data line DL.

In FIG. 2A, the control circuit 100 can further include a sixth switch T6 having a first terminal coupled to the first voltage source V1, a second terminal coupled to the data line DL, and a control terminal receiving a selection signal SEL. The selection signal SEL turns on the sixth switch T6 before the first duration of the resistive memory cell 120 performing the set operation and turns off the sixth switch T6 after the first duration begins. The selection signal SEL can be regarded as a pulse signal that initializes the set operation by setting the voltage level of the second terminal of the first switch T1 to be the first voltage $V_{SET}$.

Further, the control circuit can include a seventh switch T7. The seventh switch T7 is coupled between the control terminal of the second switch T2 and the data line DL. The seventh switch T7 is turned on in the first duration of the resistive memory cell 120 performing the set operation, and the seventh switch T7 is turned off in a second duration of the resistive memory cell 120 performing the reset operation. In addition, the initiation signal $V_{ini}$ turns on the fifth switch T5 when the seventh switch T7 is turned off.

Other than terminating the set operation, in some embodiments, the control circuit 100 can include other elements for terminating the reset operation as well.

Figure 3A:
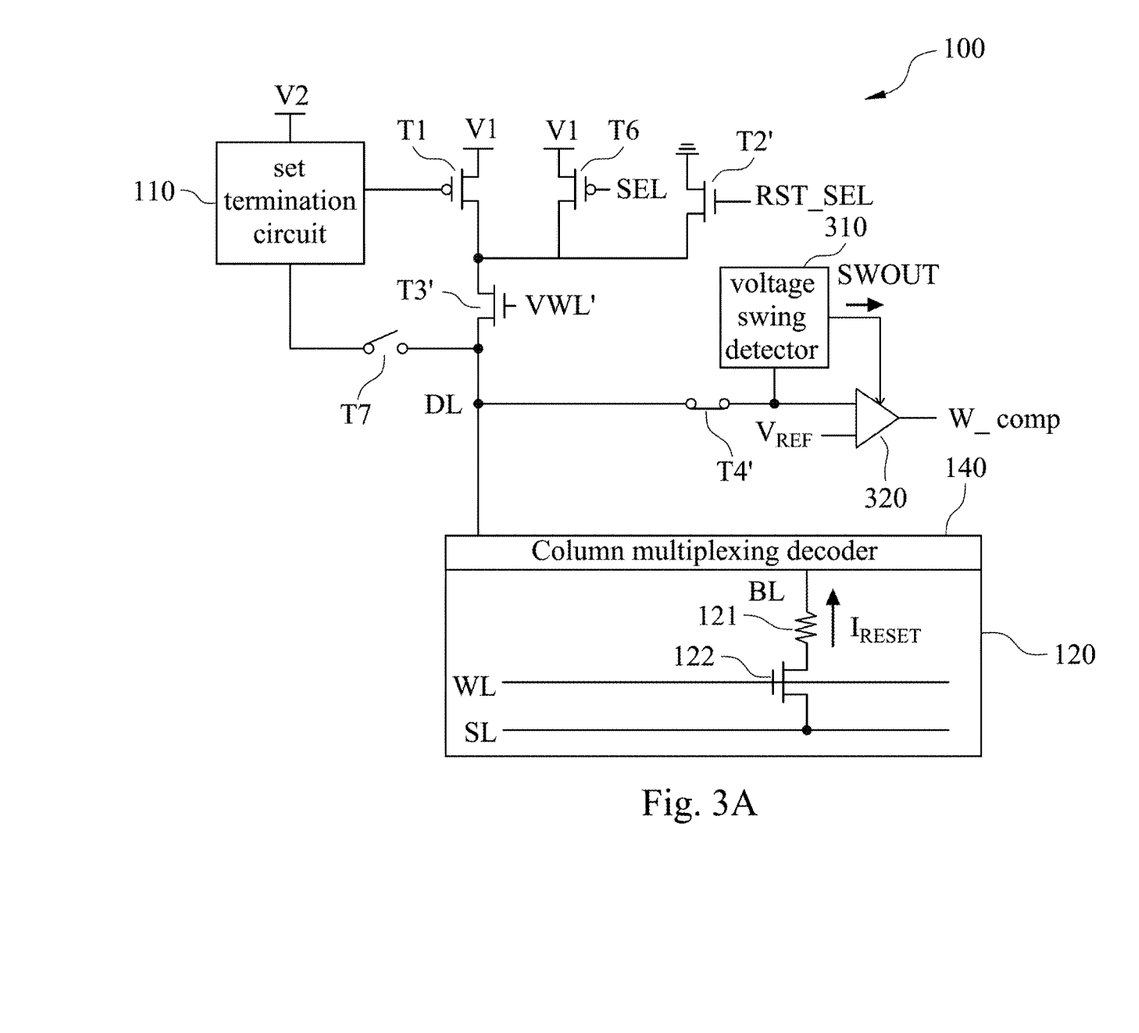
FIG. 3A is a schematic diagram illustrating the control circuit of the memory cell according to FIG. 1A of the present disclosure.
Figure 3B:
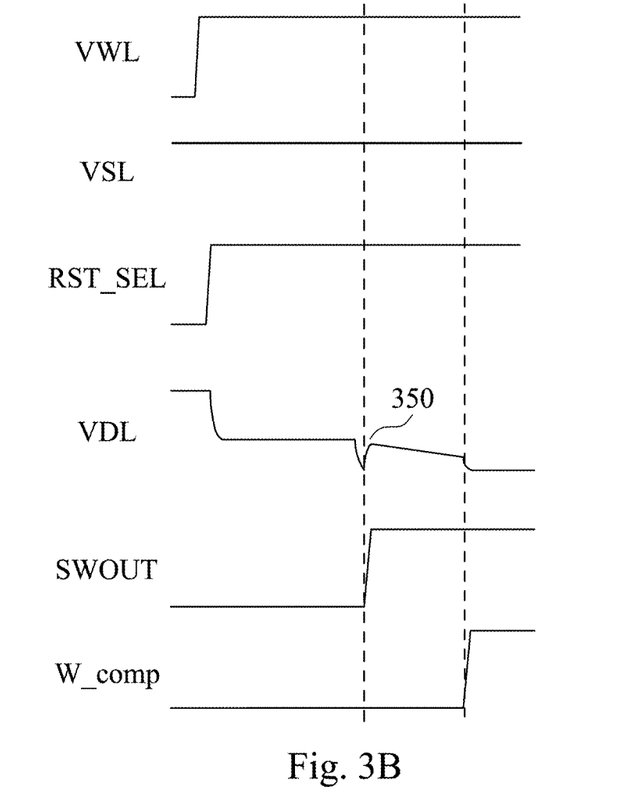
FIG. 3B illustrates various waveforms related to the reset termination operation according to FIG. 3A.

FIG. 3A is a schematic diagram illustrating the control circuit 100 of the memory cell 120 according to FIG. 1A of the present disclosure; FIG. 3B illustrates various waveforms related to the reset termination operation according to FIG. 3A. Please refer to both of FIG. 3A and FIG. 3B. The control circuit 100 further includes a second switch T2' having a first terminal coupled to the ground, a second terminal coupled to the data line DL, and a control terminal receiving the selection signal RST_SEL. In one embodiment, the selection signal RST_SEL turns off the second switch T2' in the first duration of the resistive memory cell 120 performing the set operation and turns on the second switch T2' in the second duration of the resistive memory cell 120 performing the reset operation.

In addition, the control circuit 100 can include a third switch T3' coupled between the second terminal of the first switch T1 and the data line DL. In one embodiment, a first terminal of the third switch T3' is coupled to the second terminal of the second switch T2', a second terminal of the third switch T3' is coupled to the data line DL, and a control terminal of the third switch T3' is coupled to a control voltage VWL'. In one embodiment, the control voltage VWL' switches between a first state, a second state, and a third state.

In one embodiment, when one of the control voltage VWL' and the word line voltage VWL is in a first state, the other one of the control voltage VWL' and the word line voltage VWL will be in a second state. For example, in the first duration of the resistive memory cell 120 performing the set operation, the word line voltage VWL can be in a first state (e.g., $V_{WL\_SET}$), while the control voltage VWL' can be in a second state (e.g., $V_{WL\_RESET}$). On the other hand, in the second duration of the resistive memory cell 120 performing the reset operation, the word line voltage VWL can be in the second state (e.g., $V_{WL\_RESET}$), while the control voltage VWL' can be in the first state (e.g., $V_{WL\_SET}$), but the disclosure is not limited thereto.

Moreover, the control circuit 100 can further include a voltage swing detector 310 and a voltage-type resistance monitor 320 (e.g., a voltage comparator). The voltage swing detector 310 is coupled to the data line DL. The voltage-type resistance monitor 320 has a first input coupled to the data line DL, a second input coupled to a reference voltage $V_{REF}$, and a third input receiving a command SWOUT from the voltage swing detector 310.

In some embodiment, the control circuit 100 can further include a fourth switch T4' coupled between the voltage swing detector 310 and the data line DL. The fourth switch T4' is turned off in the first duration of the resistive memory cell 120 performing the set operation, and the fourth switch T4' is turned on in the second duration of the resistive memory cell 120 performing the reset operation.

In the second duration of the resistive memory cell 120 performing the reset operation, the word line voltage VWL (at a high level), the source line voltage VSL (at a high level), and the bit line voltage (at the low level (not shown)) can be respectively applied to the control terminal of the select transistor 122, the second terminal of the select transistor 122, and the bit line BL to create a current $I_{RESET}$ for changing the resistive memory cell 120 from the LRS to the HRS.

In one embodiment, when the programmable resistor 121 starts to change to the HRS in the second duration of the resistive memory cell 120 performing the reset operation, there will occur a negative voltage swing 350 on the data line DL, and the voltage swing detector 310 will trigger the voltage-type resistance monitor 320 with the command SWOUT in response to the negative voltage swing 350. After being triggered by the command SWOUT, the voltage-type resistance monitor 320 will start to determine whether the data line voltage VDL of the data line DL is lower than the reference voltage $V_{REF}$ in the second duration of the resistive memory cell 120 performing the reset operation. When the voltage-type resistance monitor 320 determines the data line voltage VDL of the data line DL is lower than the reference voltage $V_{REF}$, it represents that the resistive memory cell 120 has reached the target resistance corresponding to the HRS. Under this situation, the voltage-type resistance monitor 320 will output a write complete signal W_comp, and the third switch T3' will be turned off by the control voltage VWL' being in the third state to terminate the reset operation.

From another point of view, the voltage-type resistance monitor 320 is used for tuning the resistance of the resistive memory cell 120 based on a comparison result between the data line voltage VDL and the reference voltage $V_{REF}$. Specifically, the voltage-type resistance monitor 320 will control the voltage on the resistive memory cell 120 to gradually increase the resistance of the resistive memory cell 120. When the resistance of the resistive memory cell 120 reaches the target resistance corresponding to the HRS, the voltage-type resistance monitor 320 can output the write complete signal W_comp, and the third switch T3 can be turned off by the control voltage VWL' being in the third state to terminate the reset operation.

That is, other than terminating the set operation of the resistive memory cell 120, the proposed control circuit 100 can terminate the reset operation of the resistive memory cell 120 of the memory array after determining the resistance of the resistive memory cell 120 has reached the target resistance corresponding to the HRS based on the comparison result between the data line voltage VDL and the reference voltage $V_{REF}$.

In brief, the present disclosure proposes mechanisms for terminating set/reset operations, and hence the over-set or over-reset problem can be avoided. Meanwhile, the power consumption for the set/reset operation can be also reduced since the set/reset operations are terminated in time.

In one embodiment, the present disclosure proposes a specific structure of the voltage swing detector 310 for generating the command SWOUT after detecting negative voltage swings.

Figure 4A:
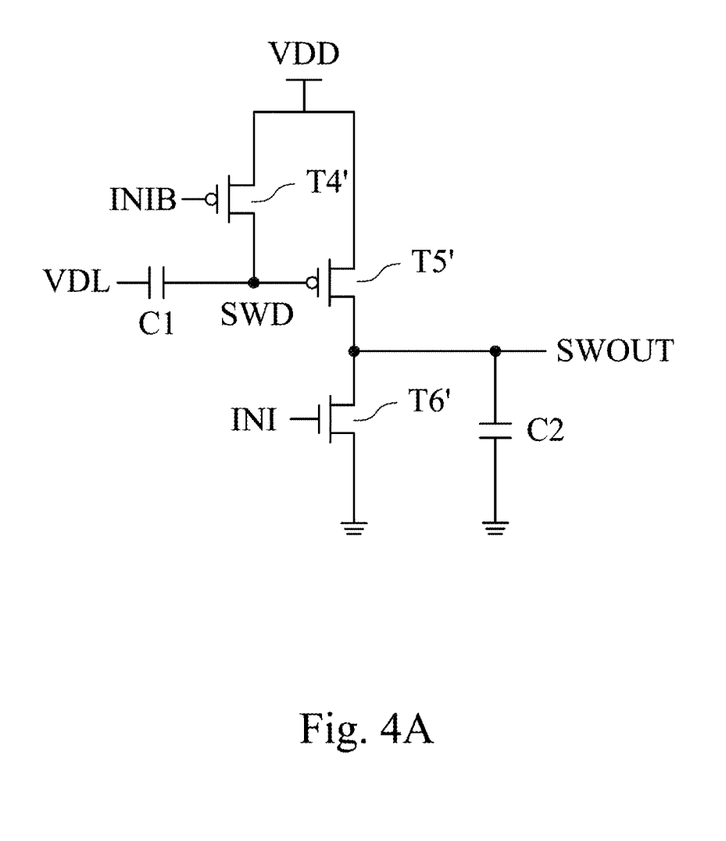
FIG. 4A illustrates details of the voltage swing detector according to FIG. 3A of the present disclosure.

FIG. 4A illustrates details of the voltage swing detector 310 according to FIG. 3A of the present disclosure. In FIG. 4A, the voltage swing detector 310 includes a first capacitor C1, a fourth switch T4', a fifth switch T5', a sixth switch T6', and a second capacitor C2. The first capacitor C1 has a first terminal receiving the data line voltage VDL. The fourth switch T4' has a first terminal coupled to a second voltage source VDD, a second terminal coupled to a second terminal of the first capacitor C1, and a control terminal coupled to a first signal INIB. The fifth switch T5' has a first terminal coupled to the second voltage source VDD and a control terminal coupled to the second terminal of the first capacitor C1. The sixth switch T6' has a first terminal coupled to a second terminal of the fifth switch T5', a second terminal coupled to the ground, and a control terminal coupled to a second signal INI. The second capacitor C2 has a first terminal coupled to the second terminal of the fifth switch T5' and a second terminal coupled to the ground. When the negative voltage swing 350 shown in FIG. 3B occurs on the data line DL, an output voltage on the second terminal of the second capacitor C2 will be pulled up to a third voltage of the second voltage source VDD and accordingly forms the command SWOUT.

Figure 4B:
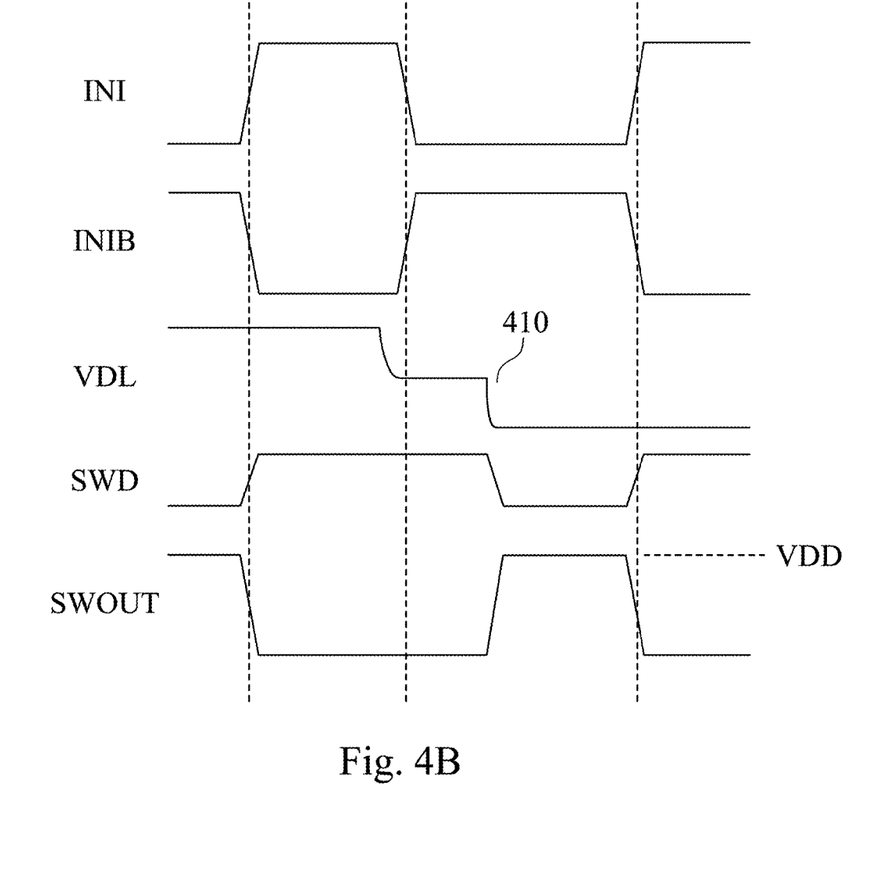
FIG. 4B illustrates various waveforms for controlling the voltage swing detector of FIG. 4A.

FIG. 4B illustrates various waveforms for controlling the voltage swing detector 310 of FIG. 4A. In the present embodiment, the voltage variations of the first signal INIB, the second signal INI, the data line voltage VDL, a node SWD, and the command SWOUT are shown in FIG. 4B. In short, when a negative voltage swing 410 occurs on the data line DL, an output voltage on the second terminal of the second capacitor C2 will be pulled up to a third voltage of the second voltage source VDD and accordingly forms the command SWOUT.

In some embodiments, the present disclosure proposes some auto-switching structures for automatically switching a write operation (which can be generally knowns as the set operation, the reset operation, and the forming operation) to another resistive memory cell in the next column after the write operation of the resistive memory cell 120 is finished, where the resistive memory cell 120 and the another resistive memory cell both belong to the same memory array, and the another resistive memory cell is on a column subsequent to the resistive memory cell 120.

Figure 5A:
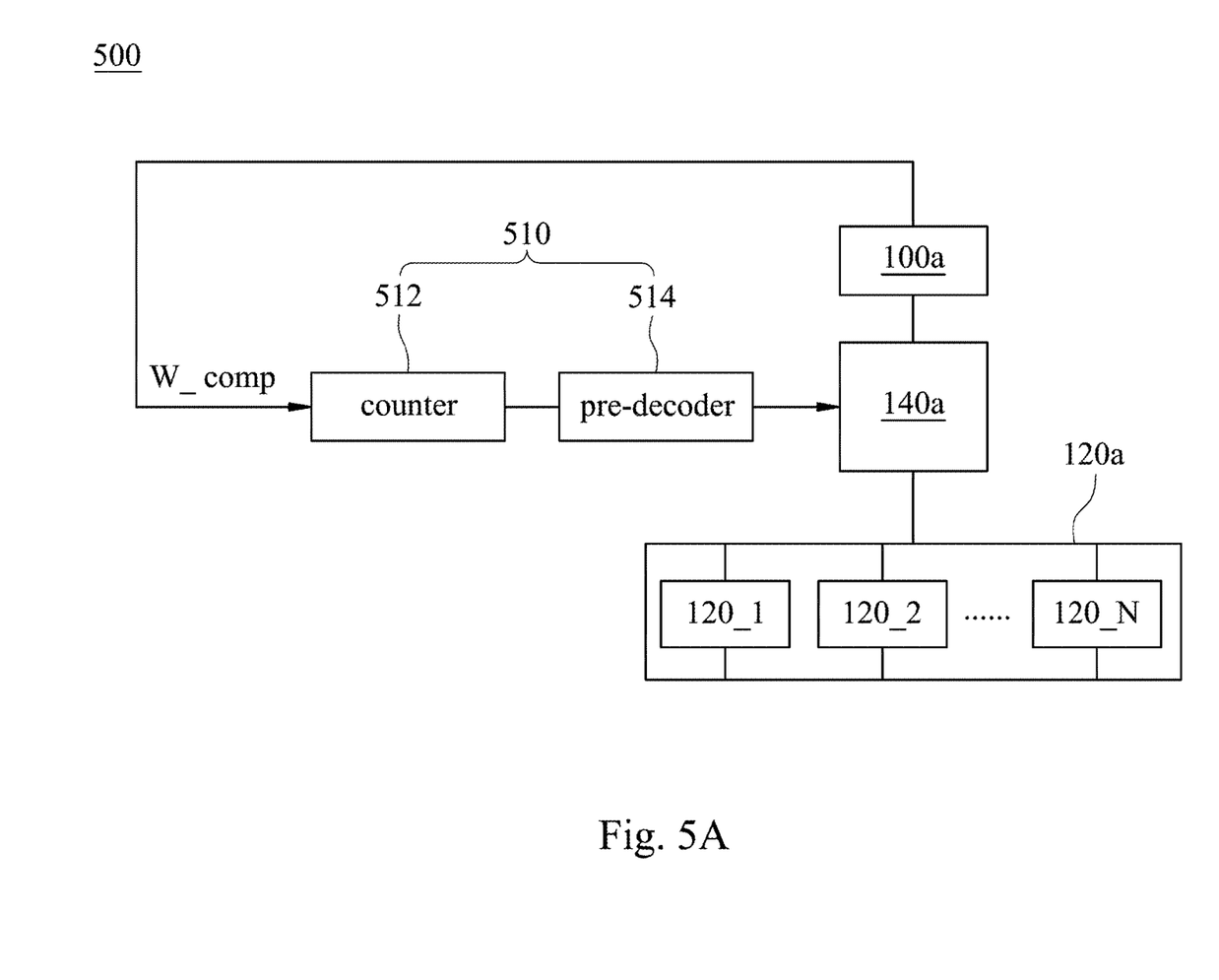
FIG. 5A is a schematic diagram of a memory device according to an exemplary embodiment of the present disclosure.

FIG. 5A is a schematic diagram of a memory device 500 according to an exemplary embodiment of the present disclosure. In the present embodiment, the memory device 500 includes a control circuit 100a, a column multiplexing decoder 140a, a memory array 120a, and an auto-switching structure 510. The memory array 120a includes, for example, resistive memory cells 120_1 to 120_N (N is a positive integer). The auto-switching structure 510 includes a counter 512 and a pre-decoder 514. At an initial stage of the memory device 500 of writing the memory array 120a, the counter 512 may output a counting number (e.g., 1) to the pre-decoder 514, and the pre-decoder 514 may pre-decode the counting number (e.g., 1) as an address for the column multiplexing decoder 140a to access, for example, the resistive memory cell 120_1. Next, the control circuit 100a may perform the write operation to the resistive memory cell 120_1 according to the aforementioned teachings and output the write complete signal W_comp after finishing the write operation.

The counter 512 may receive the write complete signal W_comp and increment the counting number (e.g., 2) for accessing, for example, the resistive memory cell 120_2 in response to the write complete signal W_comp, wherein the resistive memory cell 120_2 may be on a column subsequent to the resistive memory cell 120_1. Next, the pre-decoder 514 may pre-decode the counting number (e.g., 2) as an address for the column multiplexing decoder 140a to access, for example, the resistive memory cell 120_2. Next, the control circuit 100a may perform the write operation to the resistive memory cell 120_2 according to the aforementioned teachings and output the write complete signal W_comp after finishing the write operation. The aforementioned operations can be iteratively performed until all of the resistive memory cells 120_1 to 120_N in the memory array 120a are formed, which will not be repeated herein.

Figure 5B:
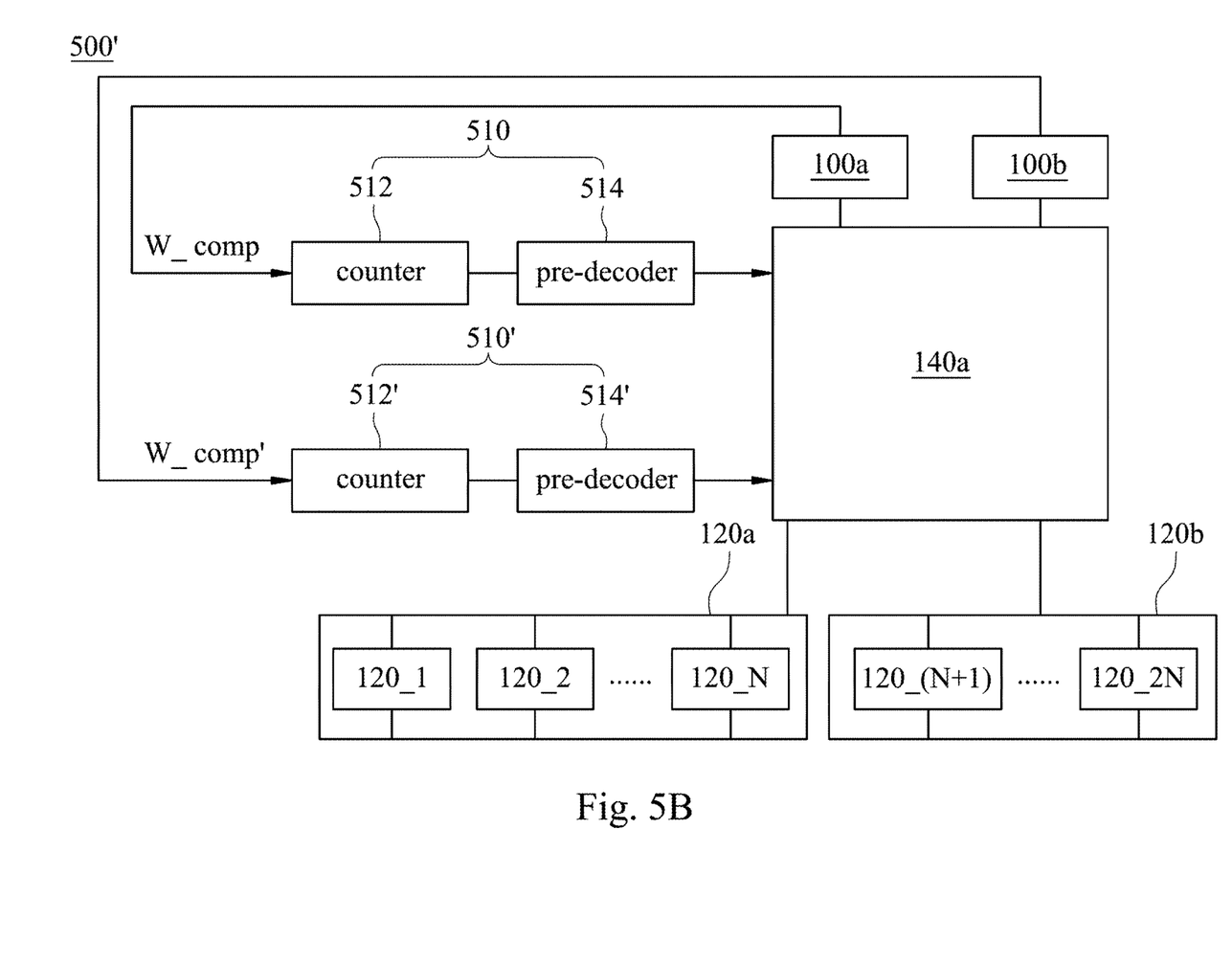
FIG. 5B is a schematic diagram of a memory device according to FIG. 5A.

In some embodiments, the memory device 500 in FIG. 5A can be further extended to the scenario illustrated in FIG. 5B, which is a schematic diagram of a memory device 500' according to FIG. 5A. As shown in FIG. 5B, an auto-switching structure 510' including a counter 512' and a pre-decoder 514' shares the column multiplexing decoder 140a with the auto-switching structure 510. The auto-switching structure 510' can be configured to write resistive memory cells 120_(N+1) to 120_2 N in a memory array 120b by a control circuit 100b. In the present embodiment, the memory arrays 120a and 120b can be different parts of an actual memory array of the memory device 500', but illustrated separately for better understanding.

The operations performed by the counter 512' in response to a write complete signal W_comp', the pre-decoder 514', the column multiplexing decoder 140a, and the control circuit 100b to write the resistive memory cells 120_(N+1) to 120_2 N can be referred to the descriptions of FIG. 5A, which will not be repeated herein.

It should be noted that the counter 512 can independently increment the counting number for accessing the resistive memory cell in the next column of the memory array 120a in response to the write complete signal W_comp without waiting for the counter 512' to receive the write complete signal W_comp', or vice versa. Therefore, the efficiency of writing the actual array of the memory device 500' can be improved.

Figure 5C:
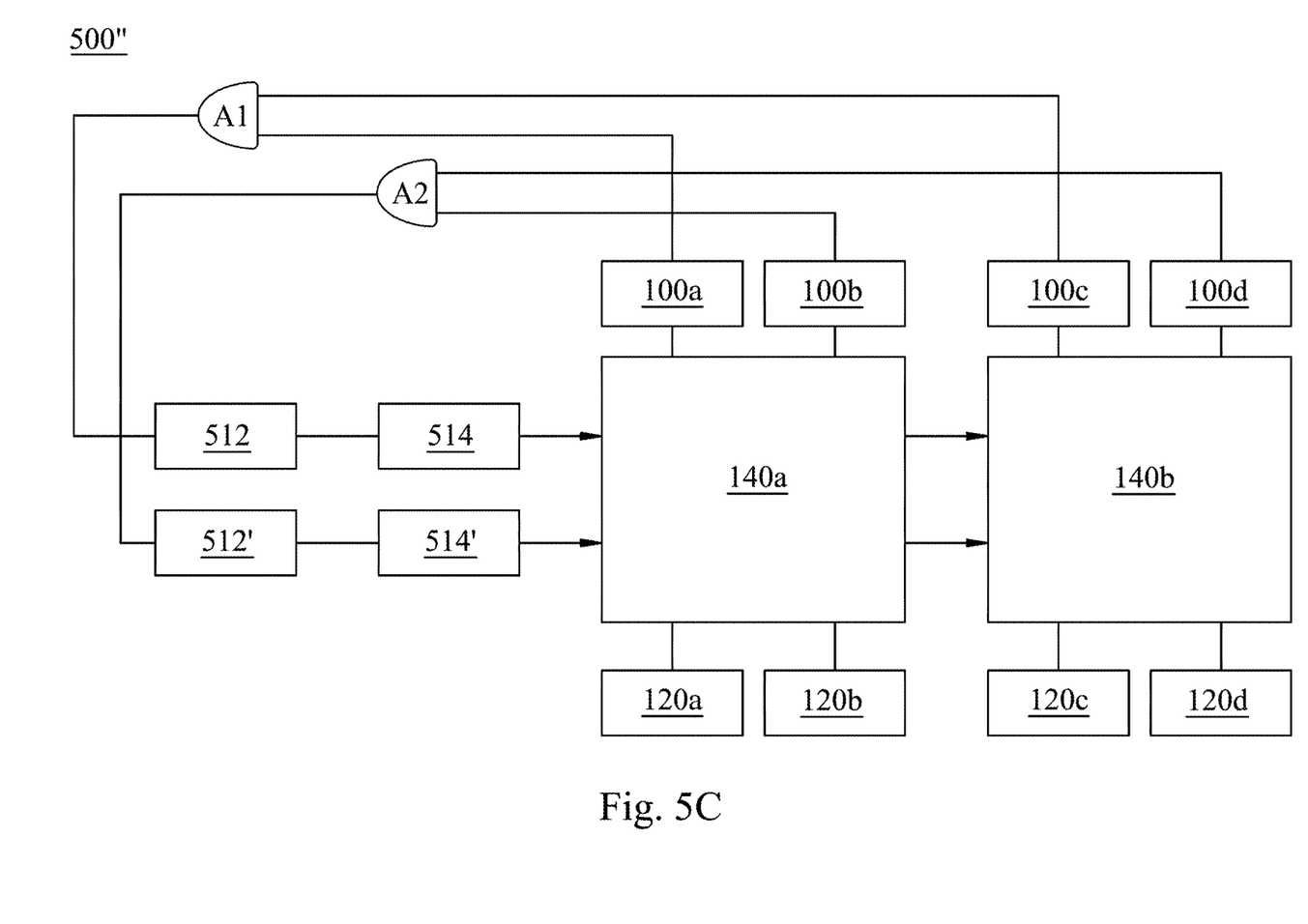
FIG. 5C is a schematic diagram of a memory device according to FIG. 5B.

In other embodiments, the memory device 500' in FIG. 5B can be further extended to the scenario illustrated in FIG. 5C, which is a schematic diagram of a memory device 500" according to FIG. 5B. In the present embodiment, when the counter 512 outputs its counting number, the pre-decoder 514 can pre-decode the counting number as an address and accordingly feed to the column multiplexing decoders 140a and 140b. In response thereto, the column multiplexing decoders 140a and 140b may respectively select the resistive memory cells in the memory arrays 120a and 120c corresponding to the counting number. Next, the control circuits 100a and 100c can write the currently selected resistive memory cells in the memory arrays 120a and 120c and output their own write complete signals. The write complete signals from the control circuits 100a and 100c are then fed to an AND gate A1. That is, when both of the control circuits 100a and 100c finish their current write operations, the counter 512 will be triggered by the output of the AND gate A1 to start to write the resistive memory cells in the memory arrays 120a and 120c on the next column.

Similarly, when the counter 512' outputs its counting number, the pre-decoder 514' can pre-decode the counting number as an address and accordingly feed to the column multiplexing decoders 140a and 140b. In response thereto, the column multiplexing decoders 140a and 140b may respectively select the resistive memory cells in the memory arrays 120b and 120d corresponding to the counting number. Next, the control circuits 100b and 100d can write the currently selected resistive memory cells in the memory arrays 120b and 120d and output their own write complete signals. The write complete signals from the control circuits 100b and 100d are then fed to an AND gate A2. That is, when both of the control circuits 100b and 100d finish their current write operations, the counter 512' will be triggered by the output of the AND gate A2 to start to write the resistive memory cells in the memory arrays 120b and 120d on the next column.

The memory arrays 120a, 120b, 120c, and 120d can be different parts of an actual memory array of the memory device 500", but illustrated separately for better understanding.

Similar to the teachings of FIG. 5B, the counters 512 and 512' can function independently, and hence the efficiency of writing the actual array of the memory device 500" can be improved.

In some embodiments, the memory device 500" in FIG. 5C can be further extended to a memory device including more column multiplexing decoders, control circuits, memory arrays, and auto-switching structures based on the teachings of FIG. 5A, FIG. 5B, and FIG. 5C, but the present disclosure is not limited thereto.

Figure 6A:
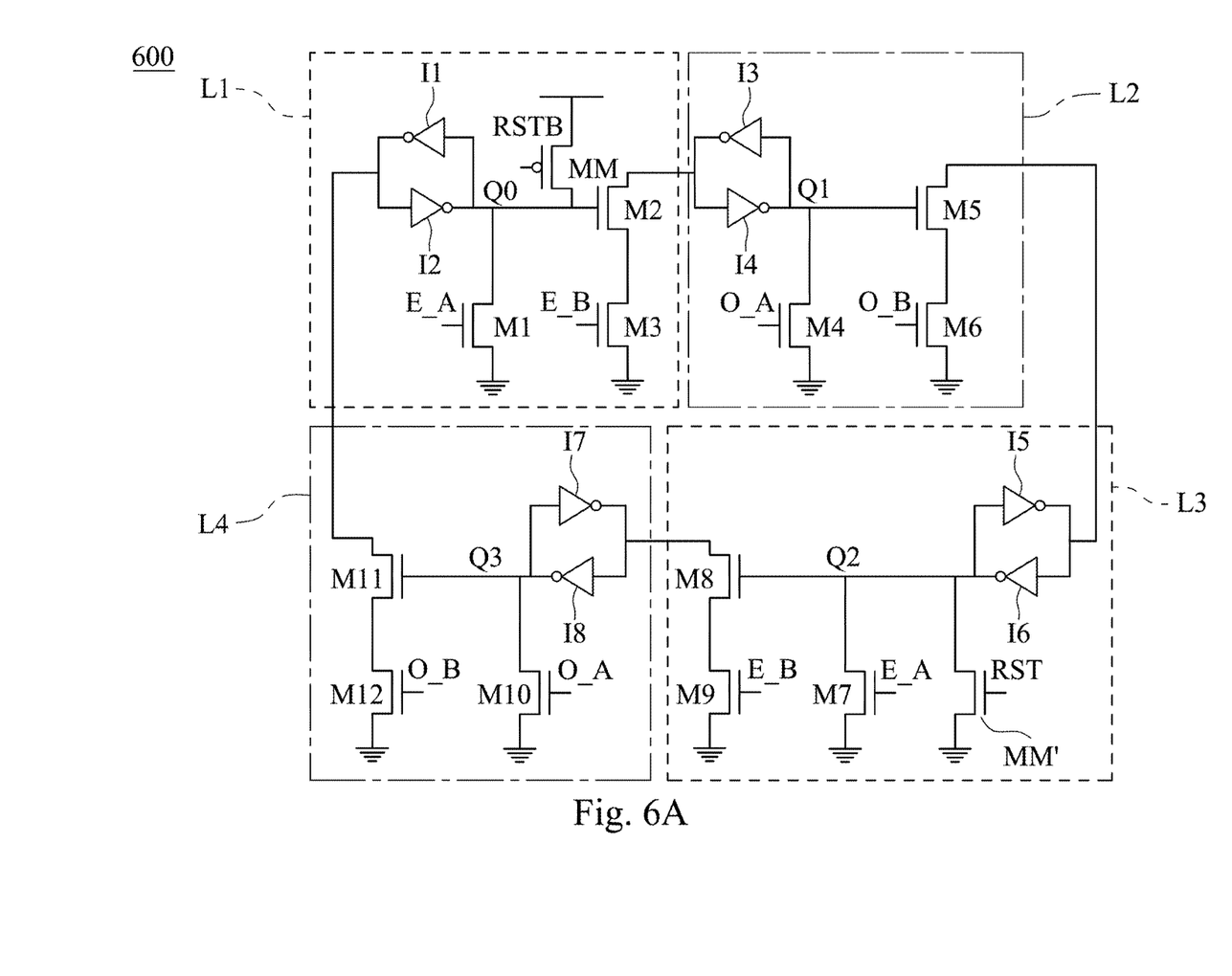
FIG. 6A is a schematic diagram of an auto-switching structure according to a second embodiment of the present disclosure.

FIG. 6A is a schematic diagram of an auto-switching structure 600 according to a second embodiment of the present disclosure. In the present embodiment, the auto-switching structure 600 may be used to replace auto-switching structures 510 or 510', but the present disclosure is not limited thereto. The auto-switching structure 600 includes a first latch circuit L1, a second latch circuit L2, a third latch circuit L3, and a fourth latch circuit L4.

The first latch circuit L1 includes a first inverter I1, a second inverter I2, a first transistor M1, a second transistor M2, a third transistor M3, and a first specific transistor MM. The second inverter I2 has an input terminal coupled to an output terminal of the first inverter I1 and an output terminal coupled to an input terminal of the first inverter I1. The first transistor M1 has a first terminal coupled to the input terminal of the first inverter I1, a second terminal coupled to the ground, and a control terminal receiving a first input signal E_A. The second transistor M2 has a control terminal coupled to the input terminal of the first inverter I1. The third transistor M3 has a first terminal coupled to a second terminal of the second transistor M2, a second terminal coupled to the ground, and a control terminal receiving a second input signal E_B. The first specific transistor MM has a first terminal coupled to a voltage source, a second terminal coupled to the input terminal of the first inverter I1, and a control terminal receiving a reset signal RSTB (e.g., a logic 0).

The second latch circuit L2 includes a third inverter I3, a fourth inverter I4, a fourth transistor M4, a fifth transistor M5, and a sixth transistor M6. The third inverter I3 has an output terminal coupled to a first terminal of the second transistor M2. The fourth inverter I4 has an input terminal coupled to an output terminal of the third inverter I3 and an output terminal coupled to an input terminal of the third inverter I3. The fourth transistor M4 has a first terminal coupled to the input terminal of the third inverter I3, a second terminal coupled to the ground, and a control terminal receiving a third input signal O_A. The fifth transistor M5 has a control terminal coupled to the input terminal of the third inverter I3. The sixth transistor M6 has a first terminal coupled to a second terminal of the fifth transistor M5, a second terminal coupled to the ground, and a control terminal receiving a fourth input signal O_B.

The third latch circuit L3 includes a fifth inverter I5, a sixth inverter I6, a second specific transistor MM', a seventh transistor M7, an eighth transistor M8, and a ninth transistor M9. The fifth inverter I5 has an output terminal coupled to a first terminal of the fifth transistor M5. The sixth inverter I6 has an input terminal coupled to an output terminal of the fifth inverter I5 and an output terminal coupled to an input terminal of the fifth inverter I5. The second specific transistor MM' has a first terminal coupled to the input terminal of the fifth inverter I5, a second terminal coupled to the ground, and a control terminal receiving a reset signal RST (e.g., a logic 1). The seventh transistor M7 has a first terminal coupled to the input terminal of the fifth inverter I5, a second terminal coupled to the ground, and a control terminal receiving the first input signal E_A. The eighth transistor M8 has a control terminal coupled to the input terminal of the fifth inverter I5. The ninth transistor M9 has a first terminal coupled to a second terminal of the eighth transistor M8, a second terminal coupled to the ground, and a control terminal receiving the second input signal E_B.

The fourth latch circuit L4 includes a seventh inverter I7, an eighth inverter I8, a tenth transistor M10, an eleventh transistor M11, and a twelfth transistor M12. The seventh inverter I7 has an output terminal coupled to a first terminal of the eighth transistor M8. The eighth inverter I8 has an input terminal coupled to an output terminal of the seventh inverter I7 and an output terminal coupled to an input terminal of the seventh inverter I7. The tenth transistor M10 has a first terminal coupled to the input terminal of the seventh inverter I7, a second terminal coupled to the ground, and a control terminal receiving the third input signal O_A. The eleventh transistor M11 has a first terminal coupled to the output terminal of the first inverter I1 and a control terminal coupled to the input terminal of the seventh inverter I7. The twelfth transistor M12 has a first terminal coupled to a second terminal of the eleventh transistor M11, a second terminal coupled to the ground, and a control terminal receiving the fourth input signal O_B.

In one embodiment, the first specific transistor MM is a p-type transistor, and the second specific transistor MM' is an n-type transistor, but the present disclosure is not limited thereto.

Figure 6B:
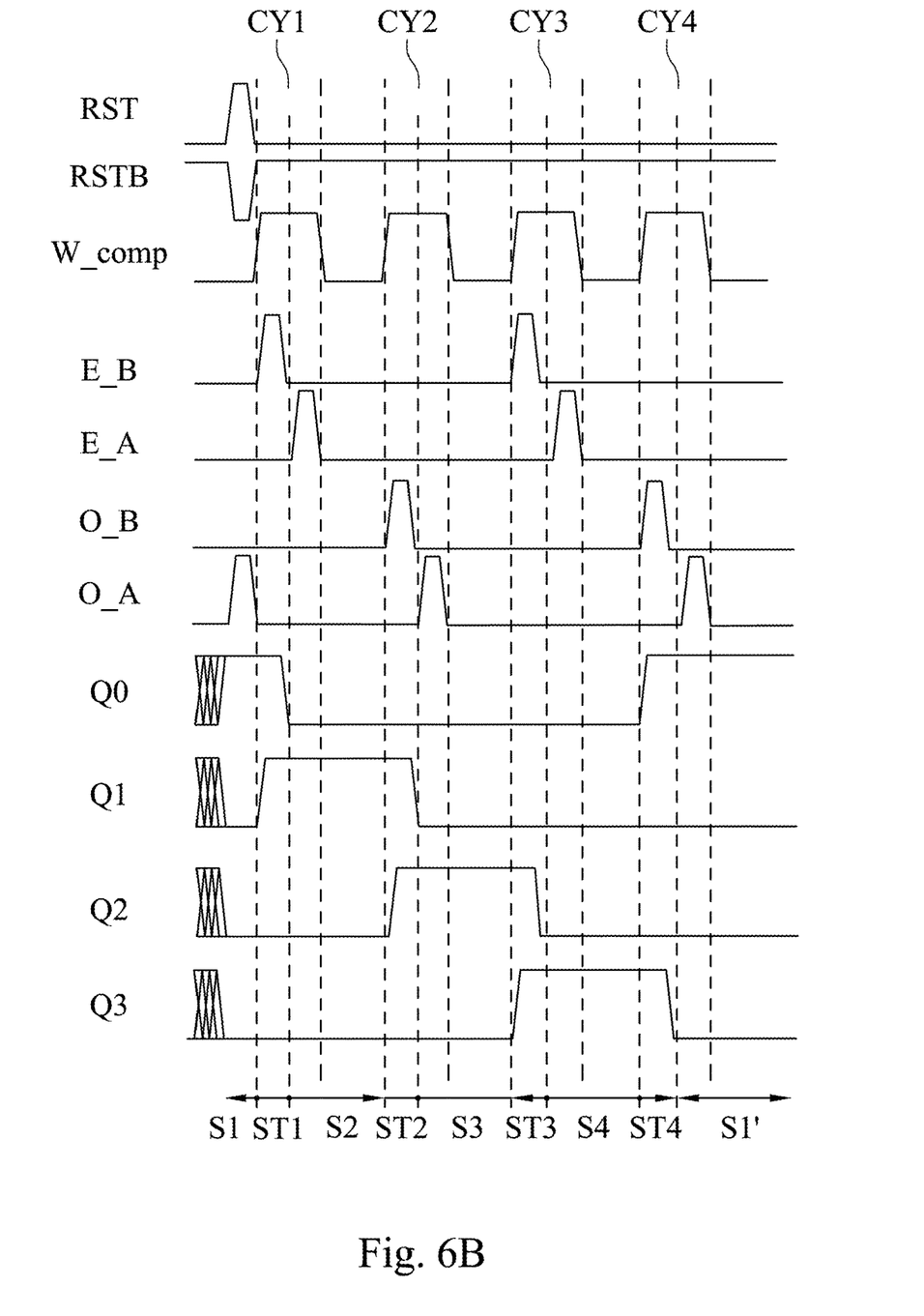
FIG. 6B illustrates various waveforms for controlling the auto-switching structure of FIG. 6A.

FIG. 6B illustrates various waveforms for controlling the auto-switching structure 600 of FIG. 6A. In the present embodiment, the voltage variations of the write complete signal W_comp, the first input signal E_A, the second input signal E_B, the third input signal O_A, the fourth input signal O_B, nodes Q0 to Q4 are shown in FIG. 6B.

As can be observed in FIG. 6B, the second input signal E_B is at a first level (e.g., a high level or logic 1) during a first half of a first cycle CY1 of the write complete signal W_comp and then become a second level (i.e., a low level or logic 0) in a second half of the first cycle CY1 of the write complete signal W_comp. The first input signal E_A is at the second level during the first half of the first cycle CY1 of the write complete signal W_comp and then become the first level in the second half of the first cycle CY1 of the write complete signal W_comp. The fourth input signal O_B is at the first level during a first half of a second cycle CY2 (next to the first cycle CY1) of the write complete signal W_comp and then become the second level in a second half of the second cycle CY2 of the write complete signal W_comp. The third input signal O_A is at the second level during the first half of the second cycle CY2 of the write complete signal W_comp and then become the first level in the second half of the second cycle CY2 of the write complete signal W_comp.

As for a third cycle CY3 and a fourth cycle CY4, the variations of the first input signal E_A, the second input signal E_B, the third input signal O_A, and the fourth input signal O_B can be referred to the first cycle CY1 and the second cycle CY2, which will not be repeated herein.

With the first input signal E_A, the second input signal E_B, the third input signal O_A, and the fourth input signal O_B shown in FIG. 7B, the logic values of the nodes Q0 to Q4 at stages S1, ST1, S2, ST2, S3, ST3, S4, and ST4 can be characterized by the following Table 1.

TABLE 1

|     | Q3 | Q2 | Q1 | Q0 |
|-----|----|----|----|----|
| S1  | 0  | 0  | 0  | 1  |
| ST1 | 0  | 0  | 1  | 1  |
| S2  | 0  | 0  | 1  | 0  |
| ST2 | 0  | 1  | 1  | 0  |
| S3  | 0  | 1  | 0  | 0  |
| ST3 | 1  | 1  | 0  | 0  |
| S4  | 1  | 0  | 0  | 0  |
| ST4 | 1  | 0  | 0  | 1  |
| S1' | 0  | 0  | 0  | 1  |

In Table 1, the logic 1 of the node Q0 in the stage S1 can be regarded as being shifted to the node Q1 in the stage S2 through the stage ST1; the logic 1 of the node Q1 in the stage S2 can be regarded as being shifted to the node Q2 in the stage S3 through the stage ST2; the logic 1 of the node Q2 in the stage S3 can be regarded as being shifted to the node Q3 in the stage S4 through the stage ST3; and the logic 1 of the node Q3 in the stage S4 can be regarded as being shifted back to the node Q0 in the stage S1' through the stage ST4.

That is, the logic 1 of a node will be shifted to the next node during a cycle of the write complete signal W_comp, and this mechanism can be used to switch the write operation to another resistive memory cell in the next column (i.e., the next node) after the write operation of the resistive memory cell 120 is finished.

As discussed in the above, since the resistive memory cell 120 can be switched between the HRS and the LRS, the resistive memory cell 120 can be referred to work as a single-level-cell (SLC). However, in some embodiments, the resistive memory cell 120 can also work as a multi-level-cell (MLC) by properly adjusting the word line voltage VWL and the control voltage VWL' to make the current $I_{SET}$ flowing through the programmable resistor 121 in the set operation be equal to the current $I_{RESET}$ flowing through the programmable resistor 121 in the reset operation.

In other embodiments, by varying the voltage applied to the resistive memory cell 120, there can be three levels of the current flowing through the programmable resistor 121, which makes the resistive memory cell 120 a three-level-cell. Besides, under the situation the current $I_{SET}$ being equal to the current $I_{RESET}$, the power consumption of the resistive memory cell 120 can be reduced as well.

In some embodiments, the aforementioned control circuits and auto-switching structures can be collectively referred as an auto-write structure which can be utilized to perform the set operation, reset operation, and auto-switching operation.

To sum up, the present disclosure proposes a control circuit that can terminate the set operation of the resistive memory cell of the memory array based on the voltage variation on the data line of the resistive memory cell in a positive feedback fashion. Besides, the proposed control circuit can terminate the reset operation of the resistive memory cell of the memory array after determining the resistance of the resistive memory cell has reached the target resistance corresponding to the HRS. With the mechanism for terminating the set/reset operations in time, the over-set or over-reset problem can be avoided, and the power consumption for the set/reset operation can be reduced as well.

Moreover, the present discloser proposes various auto-switching structures for automatically switching the write operation to another resistive memory cell in the next column after the write operation of the resistive memory cell is finished. Therefore, the memory array does not need a new address to be instructed to switch to the next column anymore.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A control circuit of a resistive memory cell of a memory array, comprising:
    a first switch connected between a first voltage source and a data line of the resistive memory cell of the memory array; and
    a set termination circuit, comprising:
        a second switch having a first terminal coupled to a second voltage source, a second terminal coupled to a control terminal of the first switch, and a control terminal coupled to the data line of the resistive memory cell of the memory array;
        a third switch having a first terminal coupled to the second terminal of the second switch, and a control terminal coupled to the data line;
        a fourth switch having a first terminal coupled to a second terminal of the third switch, a second terminal coupled to a ground, and a control terminal coupled to the second terminal of the second switch; and
        a fifth switch having a first terminal coupled to the control terminal of the second switch, a second terminal coupled to the ground, and a control terminal receiving an initiation signal;
    wherein when a data line voltage of the data line decreases to be lower than a first voltage in a first duration of the resistive memory cell performing a set operation, the set termination circuit turns off the first switch to terminate the set operation by stopping providing the first voltage of the first voltage source to the data line.

2. The control circuit of claim 1, wherein the first switch, the second switch, and the fifth switch are n-type transistors, and the third switch and the fourth switch are p-type transistors.

3. The control circuit of claim 1, further comprising a sixth switch having a first terminal coupled to the first voltage source, a second terminal coupled to the data line, and a control terminal receiving a selection signal, wherein the selection signal turns on the sixth switch before the first duration of the resistive memory cell performing the set operation and turns off the sixth switch after the first duration begins.

4. The control circuit of claim 3, further comprising a seventh switch coupled between the control terminal of the second switch and the data line, wherein the seventh switch is turned on in the first duration of the resistive memory cell performing the set operation, and the seventh switch is turned off in a second duration of the resistive memory cell performing a reset operation.

5. The control circuit of claim 4, wherein the initiation signal turns on the fifth switch when the seventh switch is turned on.

6. The control circuit of claim 1, further comprising a second switch having a first terminal coupled to a ground, a second terminal coupled to the data line, and a control terminal receiving a selection signal, wherein the selection signal turns off the second switch in the first duration of the resistive memory cell performing the set operation and turns on the second switch in a second duration of the resistive memory cell performing a reset operation.

* * * * *